(12) United States Patent
Xiong et al.

(10) Patent No.: US 11,982,945 B2
(45) Date of Patent: May 14, 2024

(54) TWO-PHOTON-POLYMERIZATION LASER DIRECT WRITING SYSTEM BASED ON ACOUSTO-OPTIC DEFLECTOR

(71) Applicant: HUAZHONG UNIVERSITY OF SCIENCE AND TECHNOLOGY, Wuhan (CN)

(72) Inventors: Wei Xiong, Wuhan (CN); Binzhang Jiao, Wuhan (CN); Hui Gao, Wuhan (CN); Yuncheng Liu, Wuhan (CN); Xuhao Fan, Wuhan (CN); Leimin Deng, Wuhan (CN)

(73) Assignee: HUAZHONG UNIVERSITY OF SCIENCE AND TECHNOLOGY, Wuhan (CN)

( * ) Notice: Subject to any disclaimer, the term of this patent is extended or adjusted under 35 U.S.C. 154(b) by 439 days.

(21) Appl. No.: 17/501,183

(22) Filed: Oct. 14, 2021

(65) Prior Publication Data
US 2022/0221796 A1   Jul. 14, 2022

(30) Foreign Application Priority Data

Jan. 8, 2021   (CN) .......................... 202110025338.2
Jan. 14, 2021  (CN) .......................... 202110045996.8

(51) Int. Cl.
*G03F 7/20* (2006.01)
*B33Y 30/00* (2015.01)
(Continued)

(52) U.S. Cl.
CPC ............. *G03F 7/2053* (2013.01); *G02B 5/04* (2013.01); *G02B 27/0031* (2013.01);
(Continued)

(58) Field of Classification Search
CPC ............... G03F 7/2053; G03F 7/70375; G03F 7/70383; G02B 5/04; G02B 27/0031;
(Continued)

(56) References Cited

U.S. PATENT DOCUMENTS 10,101,634 B2 *  10/2018  Dieudonne ........... G02F 1/3526
10,884,343 B2 *   1/2021  Cheng ................. G03F 7/70641

* cited by examiner

*Primary Examiner* — Seung C Sohn
(74) *Attorney, Agent, or Firm* — Wenderoth, Lind & Ponack, L.L.P.

(57) ABSTRACT

A two-photon-polymerization laser direct writing system based on an acousto-optic deflector is provided, which includes an ultrafast laser device, a beam expander, a scanning field center angular dispersion compensator, a two-dimensional acousto-optic deflector, a scanning field edge angular dispersion compensator, an astigmatism compensator and a focusing objective lens, the ultrafast laser device is configured to emit an ultrafast laser; the scanning field center angular dispersion compensator is configured to conduct precompensation on an angular dispersion at a center of a scanning field; the two-dimensional acousto-optic deflector is configured to deflect the ultrafast laser on the angular dispersion at the center of the scanning field; the scanning field edge angular dispersion compensator is configured to compensate for an angular dispersion at an edge of the scanning field; the astigmatism compensator is configured to compensate for astigmatism; the focusing objective lens is configured to conduct tight-focusing on the ultrafast laser.

18 Claims, 3 Drawing Sheets

(51) Int. Cl.
*G02B 5/04* (2006.01)
*G02B 27/00* (2006.01)
*G02B 27/09* (2006.01)
*G02F 1/33* (2006.01)
*G03F 7/00* (2006.01)

(52) U.S. Cl.
CPC ........... *G02B 27/0966* (2013.01); *G02F 1/33* (2013.01); *G03F 7/70375* (2013.01); *G03F 7/70383* (2013.01); *B33Y 30/00* (2014.12)

(58) Field of Classification Search
CPC .............. G02B 27/0966; G02B 26/101; G02B 27/005; G02B 27/00; G02B 27/0025; G02F 1/33; B33Y 30/00; B29C 64/135; B29C 64/264
See application file for complete search history.

TWO-PHOTON-POLYMERIZATION LASER DIRECT WRITING SYSTEM BASED ON ACOUSTO-OPTIC DEFLECTOR

CROSS REFERENCE TO RELATED APPLICATIONS

The present disclosure claims the priority of Chinese patent application No. 2021100253382, filed to China National Intellectual Property Administration (CNIPA) on Jan. 8, 2021 and entitled "TWO-PHOTON-POLYMERIZATION LASER DIRECT WRITING SYSTEM BASED ON ACOUSTO-OPTIC DEFLECTOR", and Chinese Patent Application No. 202110045996.8, filed on Jan. 14, 2021. All of the aforementioned patent applications are incorporated herein in their entirety by reference.

TECHNICAL FIELD

The invention belongs to the technical field of laser machining, and particularly relates to a two-photon-polymerization laser direct writing system based on an acousto-optic deflector.

BACKGROUND ART

Through two-photon-polymerization laser direct writing based on a two-photon absorption effect and a two-photon polymerization effect, a three-dimensional micro-nano structure is directly obtained by exposing a light-sensitive material with a tightly focused laser point of an ultrafast laser. The two-photon absorption effect is a third-order nonlinear effect, the intensity of the two-photon absorption effect is in direct proportion to the square of light intensity. The two-photon polymerization effect refer to an effect that when the light-sensitive material is irradiated by a tightly focused ultrafast laser, the powerful two-photon absorption effect near a tight-focusing focus results in a large number of free radicals, which polymerizes into chains and forms microstructures when the concentration of the free radicals is larger than a certain threshold. Only when laser intensity is larger than a certain threshold, the two-photon polymerization effect may occur. By controlling the laser intensity, the two-photon polymerization effect only occurs in a scale smaller than an Airy disk in the tight-focusing focus, and the accuracy of microstructure machining beyond diffraction limit is realized, a machinable horizontal feature size can be below 200 nm, and a machinable longitudinal feature size can be below 1 um. The two-photon-polymerization direct writing technology with high machining resolution and a small thermal effect has been widely applied in micro-nano electronics, micro-machinery, micro-optical devices, etc.

A complex three-dimensional microstructure is manufactured by the two-photon-polymerization laser direct writing technology in a point-by-point exposure. A speed of the point-by-point exposure limits a yield of the technology and reduces practicality of the complex three-dimensional microstructure machined. For example, a periodical document "Rapid Assembly of Small Materials Building Blocks (Voxels) into LargeFunctional 3D Metamaterials" (Advanced functional materials, 2020) discloses a diffractive optical element manufactured by a commercial machining system. The diffractive optical element has a diameter of 6 mm, which meets a use requirement but cannot meet a widespread application requirement, due to the machining time as long as 50 hours. Therefore, it is the key to improve a machining speed of the two-photon-polymerization laser direct writing and shorten the machining time of a complex three-dimensional micro-nano structure in the field.

A two-photon-polymerization laser direct writing system uses a high-numerical-aperture objective lens to tightly focus the ultrafast laser, and uses a scanner to change a deflection angle of a beam, so as to realize two-dimensional movement of the tightly focused laser point in photoresist, and scanning of a two-dimensional pattern is implemented by controlling on/off of the beam. After the tightly focused laser point completes scanning of one layer of pattern, a distance between the photoresist and the objective lens is changed, and layer-by-layer scanning is conducted to expose the three-dimensional micro-nano structure. A higher machining speed requires a higher scanning speed of the tightly focused laser point. Higher frequency of changing a light beam deflection angle by the scanner results in the higher scanning speed of the tightly focused laser point, so the key to improve the machining speed is to increase the frequency with which the scanner changes the light beam deflection angle.

Scanners are divided into mechanical deflection scanners and diffractive deflection scanners. The mechanical deflection scanners including a multi-rotating mirror, a galvanometric mirror and a resonant mirror, deflect a light beam by rotating a reflecting plane. The diffractive deflection scanners, including a liquid crystal spatial light modulator, a digital micro mirror array and the acousto-optic deflector, deflect a light beam by modulating a wavefront of light. The maximum scanning frequencies of different scanners are compared in the following table, which also lists references.

| Scanner type | | Scanning frequency (Hz) | References |
|---|---|---|---|
| Mechanical deflection scanner | Multi-rotating mirror | 1600 | Lincoln POLYtek scanning head |
| | Galvanometric mirror | 2800 | Vincent Hahn, et al. Adv. Funct. Mater. (2020) |
| | Resonant mirror | 16000 | Benjamin W. Pearre. et al. Addit. Manuf. (2019) |
| Diffractive deflection scanner | Liquid crystal spatial light modulator | 0.2 | Gaszton Vizsnyiczai. et al. Opt. Express. (2014) |
| | Digital micro mirror array | 100 | Qiang Geng. et al. Nat. Commun. (2019) |
| | Acousto-optic deflector | 50000 | Liu. Y. F. et al. Rev. Sci. Instrum. (2012) |

It can be seen from the table that the acousto-optic deflector has the highest line scanning frequency as high as 50 kHz, so it is suitable for high-speed laser scanning. In CN 109514093A, a laser machining device using an acousto-optic deflector to adjust a dispersion area is provided. The device uses the acousto-optic deflector to modulate a pulse laser and realize high-speed scanning. There are two problems in the high-speed scanning of the ultrafast laser by the acousto-optic deflector. Firstly, the ultrafast laser has a large spectral width (usually 3 nm-10 nm), and generates angular dispersion when passing the acousto-optic deflector. Secondly, when during the high-speed scanning, the acousto-optic deflector focuses the light beam in a scanning direction and causes astigmatism, which will eventually make the ultrafast laser unable to be focused tightly and decrease peak power of a focused light spot, thus making two-photon-polymerization machining impossible. In order to solve the above problems, a method for compensating for angular dispersion at a center of scanning field of the acousto-optic deflector by using an angular dispersion prism is provided in CN 1749803A. In this patent, a prism vertex angle meets an angular dispersion compensation requirement, which results in low laser transmittance of the prism, and angular dispersion at an edge of the scanning field of the acousto-optic deflector is not completely compensated for, so that a laser point at the edge of the scanning field cannot be tightly focused. In US 007332705, a method for compensating for astigmatism by using a pair of acousto-optic deflectors with opposite scanning directions is provided, which has a low laser transmittance being approximately 20%, limits power of the tightly focused laser point and cannot meet a high-speed laser scanning requirement.

To sum up, there is no report on a high-speed two-photon-polymerization laser direct writing system based on an acousto-optic deflector, and high-speed and high-precision machining of any three-dimensional micro-nano structure is still impossible.

SUMMARY

In order to overcome defects in the prior art, the present embodiment aims to provide a two-photon-polymerization laser direct writing system based on an acousto-optic deflector, so as to solve the problems that there is no report on a high-speed two-photon-polymerization laser direct writing system based on an acousto-optic deflector, and high-speed and high-precision machining of any three-dimensional micro-nano structure is still impossible.

In order to realize the above object, the present disclosure provides a two-photon-polymerization laser direct writing system based on an acousto-optic deflector. The system includes: an ultrafast laser device, a beam expander, a scanning field center angular dispersion compensator, a two-dimensional acousto-optic deflector, a scanning field edge angular dispersion compensator, an astigmatism compensator and a focusing objective lens.

The ultrafast laser device is configured to emit an ultrafast laser.

The beam expander is configured to conduct collimation and beam expansion on the ultrafast laser; the ultrafast laser subjected to the collimation and beam expansion passes through the scanning field center angular dispersion compensator and the two-dimensional acousto-optic deflector in sequence.

The scanning field center angular dispersion compensator is configured to conduct precompensation on an angular dispersion at a center of a scanning field of the two-dimensional acousto-optic deflector according to parameters of the two-dimensional acousto-optic deflector.

The two-dimensional acousto-optic deflector is configured to deflect, by a predetermined angle, the ultrafast laser subjected to the precompensation on the angular dispersion at the center of the scanning field, so as to make the laser deflected meet a laser direct writing requirement; the two-dimensional acousto-optic deflector includes two one-dimensional acousto-optic deflectors which are orthogonal to each other.

The ultrafast laser deflected by the two-dimensional acousto-optic deflector passes the scanning field edge angular dispersion compensator and the astigmatism compensator in sequence, and the scanning field edge angular dispersion compensator is configured to compensate for an angular dispersion at an edge of the scanning field of the two-dimensional acousto-optic deflector; the astigmatism compensator is configured to compensate for astigmatism generated in a process of deflecting the ultrafast laser by the two-dimensional acousto-optic deflector.

The focusing objective lens is configured to conduct tight-focusing on the ultrafast laser subjected to the compensation by the astigmatism compensator and then emit the ultrafast laser to a light-sensitive material, so as to conduct a two-photon-polymerization laser direct writing on the light-sensitive material, and the predetermined angle is controlled by the two-dimensional acousto-optic deflector, so as to realize the two-photon-polymerization laser direct writing on different positions of the light-sensitive material.

In some embodiments, the scanning field center angular dispersion compensator may include an angular dispersion device and a relay lens, which are arranged in sequence.

An angular dispersion value at the scanning field center of the two-dimensional acousto-optic deflector is may be $$\sqrt{2}\frac{f_0}{v^*},$$

$f_0$ being a central driving frequency of the two-dimensional acousto-optic deflector, and v being a sound speed of the two-dimensional acousto-optic deflector.

The ultrafast laser may be incident on the angular dispersion device at a predetermined incident angle, so that a laser emerging from the angular dispersion device may have maximum power and highest energy utilization; when the laser emerging from the angular dispersion device has the maximum power, an angular dispersion value, at a central wavelength $\lambda_0$ of an ultrafast laser, of the angular dispersion device may be $\alpha$; focal power of the relay lens may be 0, and an angular magnification at the central wavelength $\lambda_0$ of the ultrafast laser may be $\beta$; and $$\alpha*\beta = -\sqrt{2}\frac{f_0}{v}.$$

In some embodiments, the scanning field edge angular dispersion compensator may include: a front lens set and a rear lens set.

The front lens set may include a biconvex lens and a meniscus lens, which may be arranged in sequence, and the rear lens set may include a biconcave lens and a biconvex lens, which may be arranged in sequence.

Angular dispersion generated by the scanning field edge angular dispersion compensator and the angular dispersion at the edge of the scanning field may be consistent in magnitude and opposite in direction; and an angular dispersion value at the edge of the scanning field may be expressed as $$\frac{d\theta}{d\lambda} = \frac{\sqrt{f_1^2 + f_2^2} - f_0}{v},$$

$\theta$ being a light beam deflection angle, which may be a predetermined angle by which the laser may be deflected, and $f_1$ and $f_2$ being driving frequencies of the two one-dimensional acousto-optic deflectors at the light beam deflection angle $\theta$ respectively.

In some embodiments, a focal length $f_c$ of the astigmatism compensator in a light beam focusing direction and a focal length of light beam focusing generated by the astigmatism in the process of deflecting the ultrafast laser by the two-dimensional acousto-optic deflector may be equal in magnitude and opposite in direction, and the focal length $f_c$ of the astigmatism compensator in a light beam focusing direction may be expressed as $$f_c = -\frac{v^2 T_{scan}}{\lambda_0 \Delta f},$$

where $T_{scan}$ is a time required for scanning a line by the two-dimensional acousto-optic deflector, and $\Delta f$ is a bandwidth of a driving frequency of the two-dimensional acousto-optic deflector.

In some embodiments, the angular dispersion device may be a refracting prism, and a vertex angle of the refracting prism may be expressed as $\theta_c = \pi - 2*\arctan(n)$, where n is a refractive index, at the central wavelength $\lambda_0$ of the ultrafast laser, of the refracting prism. A polarization direction of the ultrafast laser may be parallel to a refracting plane where the ultrafast laser may be refracted in the refracting prism, and the predetermined incident angle may be expressed as $\theta_{in} = \arctan(n)$ and an emergence angle is expressed as $\theta_{out} = \theta_{in}$.

In some embodiments, the angular dispersion device may be a diffraction grating, and the predetermined incident angle may be expressed as $\theta_{in} = \gamma$, where $\gamma$ is an included angle between a grooving surface and a grating surface of the diffraction grating.

In some embodiments, the two one-dimensional acousto-optic deflectors which are orthogonal to each other may include: a first one-dimensional acousto-optic deflector and a second one-dimensional acousto-optic deflector.

The first one-dimensional acousto-optic deflector may be configured to scan the ultrafast laser at a high speed, and the ultrafast laser may be focused in a high-speed scanning direction, so as to cause the astigmatism.

The second one-dimensional acousto-optic deflector may change a scanning position into a next line in a direction orthogonal to the high-speed scanning direction of the first one-dimensional acousto-optic deflector after the first one-dimensional acousto-optic deflector completes high-speed scanning of a line, so as to deflect the ultrafast laser by the predetermined angle.

In some embodiments, the astigmatism compensator may be a cylindrical lens.

A focal length of the cylindrical lens may be expressed as $$f_c = -\frac{v^2 T_{scan}}{\lambda_0 \Delta f}.$$

A focal length of the astigmatism compensator in the high-speed scanning direction of the first one-dimensional acousto-optic deflector and a focal length of light beam focusing generated by high-speed scanning of the first one-dimensional acousto-optic deflector may be equal in magnitude and opposite in direction.

In some embodiments, the astigmatism compensator may be a spatial light modulator.

A wavefront function, used by the spatial light modulator for modulation may be $$\varphi(x) = \frac{x^2}{2} * \frac{\Delta f}{v^2 T_{scan}},$$

where x is a coordinate of the first one-dimensional acousto-optic deflector in the high-speed scanning direction; and a focal length of the spatial light modulator in the high-speed scanning direction of the first one-dimensional acousto-optic deflector and a focal length of light beam focusing generated by high-speed scanning of the first one-dimensional acousto-optic deflector may be equal in magnitude and opposite in direction.

In some embodiments, a numerical aperture of the focusing objective lens may be larger than 0.7.

In overall, compared with the prior art, the above technical solution conceived by the present embodiment may have beneficial effects as follows:

The present embodiment provides the two-photon-polymerization laser direct writing system based on an acousto-optic deflector. According to the system, compensation can be conducted on angular dispersion at the center and edge of the scanning field of the two-dimensional acousto-optic deflector, so that horizontal feature sizes of laser focuses in a scanning range may be consistent; compensation can be conducted on the astigmatism generated in the process of the high-speed scanning of the two-dimensional acousto-optic deflector, so that the laser focuses in the scanning field range can be tightly focused and reach a diffraction limit. By eliminating the angular dispersion generated when the ultrafast laser passes the two-dimensional acousto-optic deflector, and conducting compensation on the astigmatism generated by the high-speed scanning of the two-dimensional acousto-optic deflector, a machining feature size consistent with that of a traditional two-photon-polymerization laser direct writing system may be realized, a high-speed two-photon-polymerization laser direct writing system based on an acousto-optic deflector may be further realized, and high-speed laser scanning speed of 50000 lines/s may be realized, a scanning speed of which can also reach 5000 mm/s or higher. Compared with the traditional machining system, machining efficiency can be improved by 500 times or higher, and high-speed and high-precision machining of any three-dimensional micro-nano structure can be realized.

Figure 1:
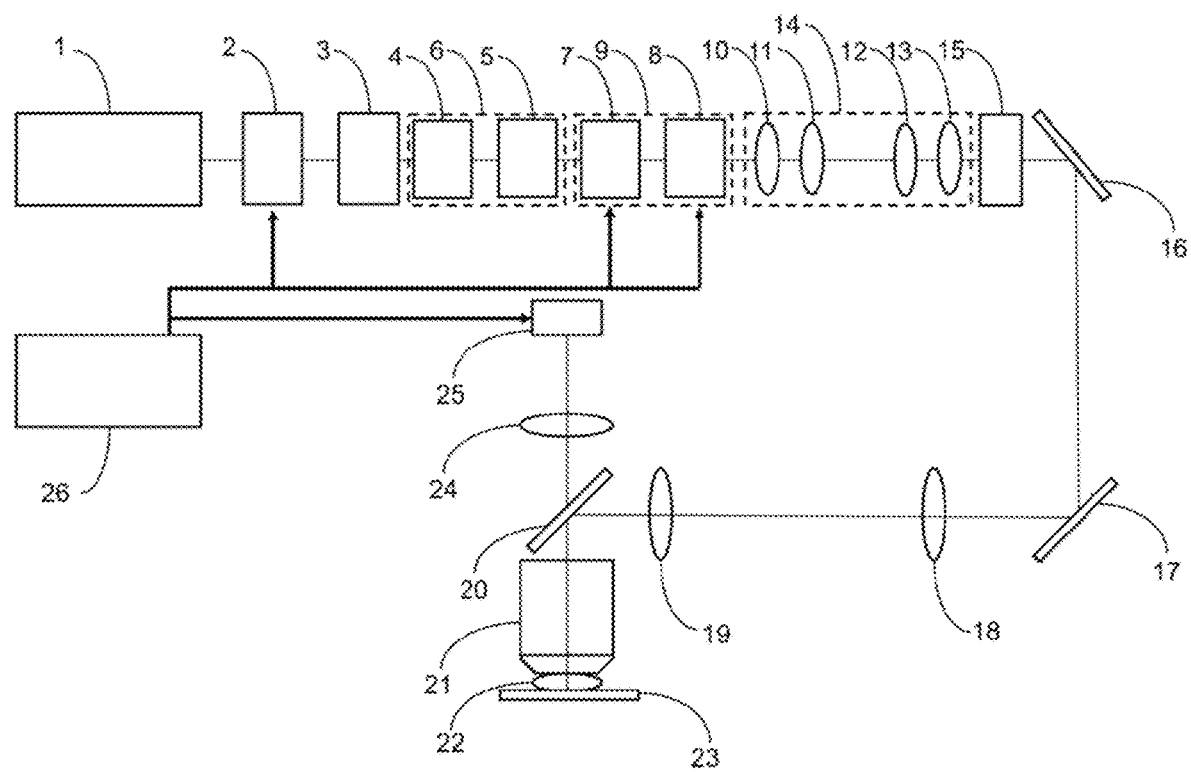
FIG. 1 is a structural diagram of a two-photon-polymerization laser direct writing system based on an acousto-optic deflector according to an embodiment of the present disclosure.

In all the drawings, the same reference numerals denotes the same elements or structures, which include: an ultrafast laser device 1, an acousto-optic intensity modulator 2, a beam expander 3, an angular dispersion device 4, a relay lens 5, a scanning field center angular dispersion compensator 6, a first one-dimensional acousto-optic deflector 7, a second one-dimensional acousto-optic deflector 8, a two-dimensional acousto-optic deflector 9, a first biconvex lens 10, a meniscus lens 11, a biconcave lens 12, a second biconvex lens 13, a scanning field edge angular dispersion compensator 14, an astigmatism compensator 15, a first light guide plate 16, a second light guide plate 17, a first lens set 18, a second lens set 19, an optical splitter 20, a focusing objective lens 21, photoresist 22, an objective table 23, a tube lens 24, an image sensor 25, a controller 26, a refracting prism 401, a diffraction grating 402, a laser beam 600 incident on the angular dispersion device, a laser beam 1500 incident on the astigmatism compensator, a cylindrical lens 1501 and a spatial light modulator 1502.

DETAILED DESCRIPTION OF THE EMBODIMENTS

In order to make the object, the technical solution and the advantages of the present disclosure more clear, the present disclosure is further described in detail with reference to the following drawings and embodiments. It should be understood that the specific embodiments described herein are only used to explain the present disclosure, but not to limit the present disclosure.

In order to overcome defects in the prior art and meet improvement requirements, a two-photon-polymerization laser direct writing system based on an acousto-optic deflector is provided by the present disclosure. According to the system, the high-speed laser scanning with a speed of 50000 lines/s is realized by using the acousto-optic deflector, so that a scanning speed of a laser point reaches 5000 mm/s or higher. According to the present disclosure, angular dispersion generated when ultrafast laser passes through a two-dimensional acousto-optic deflector is eliminated, and compensation is conducted on astigmatism generated by the high-speed scanning of the two-dimensional acousto-optic deflector, so that laser points in a scanning range may be tightly focused and have consistent peak power, and machining feature sizes at any positions in the scanning range are consistent and reach diffraction limit values, thereby realizing high-speed and high-precision machining of any three-dimensional micro-nano structure. By eliminating the angular dispersion generated when the ultrafast laser passes through the acousto-optic deflector, and conducting compensation on the astigmatism generated by the high-speed scanning of the two-dimensional acousto-optic deflector, the machining feature size consistent with that of a traditional two-photon-polymerization laser direct writing system is realized, a machining speed is greatly improved, and machining efficiency can be improved by 500 times or higher.

Specifically, the two-photon-polymerization laser direct writing system based on an acousto-optic deflector includes: a two-dimensional acousto-optic scanning assembly, an astigmatism compensator, a focusing objective lens and an observation assembly.

The two-dimensional acousto-optic scanning assembly is configured to conduct rapid two-dimensional scanning by an ultrafast laser beam and eliminates the angular dispersion generated when the ultrafast laser passes through the acousto-optic deflector, and includes an ultrafast laser device, an acousto-optic intensity modulator, a beam expander, a scanning field center angular dispersion compensator, a two-dimensional acousto-optic deflector and a scanning field edge angular dispersion compensator. During working, the ultrafast laser is emitted from the ultrafast laser device and passes through the acousto-optic intensity modulator to adjust power of the ultrafast laser; a modulated laser beam can be subjected to collimation and beam expansion while passing through the beam expander. And then, the laser passes through the scanning field center angular dispersion compensator to conduct precompensation on angular dispersion at a center of the scanning field of the two-dimensional acousto-optic deflector; and passes through the two-dimensional acousto-optic deflector to be deflected. Finally, the scanning field edge angular dispersion compensator compensates for angular dispersion at an edge of the scanning field.

The two-dimensional acousto-optic deflector includes two orthogonal one-dimensional acousto-optic deflectors.

The scanning field center angular dispersion compensator is configured to compensate for the angular dispersion at the center of the scanning field, and angular dispersion generated by the scanning field center angular dispersion compensator and the angular dispersion at the center of the scanning field are equal in magnitude and opposite in direction. An angular dispersion value at the center of the scanning field is expressed as $$\sqrt{2}\frac{f_0}{v},$$

$f_0$ being a central driving frequency of the two-dimensional acousto-optic deflector, and v being a sound speed of the two-dimensional acousto-optic deflector.

Preferably, an included angle between a principal plane of the scanning field center angular dispersion compensator and any one-dimensional acousto-optic deflector of the two-dimensional acousto-optic deflector is 45°.

Preferably, the scanning field edge angular dispersion compensator includes a front lens set and a rear lens set.

Further preferably, the front lens set includes a biconvex lens and a meniscus lens which are arranged in sequence. The biconvex lens is made of H-K9L, a radius of curvature of a front surface of the biconvex lens is 48.12 mm, a radius of curvature of a rear surface of the biconvex lens is −31.16 mm, and a distance between the front surface and the rear surface is 6 mm. The meniscus lens is made of H-ZF88, a radius of curvature of a front surface of the meniscus lens is −31.03 mm, a radius of curvature of a rear surface of the meniscus lens is −119.94 mm, and a distance between the front surface and the rear surface is 2 mm.

Further preferably, the rear lens set includes a biconcave lens and a biconvex lens which are arranged in sequence. The biconcave lens is made of H-K9L, a radius of curvature of a front surface of the biconcave lens is −95.81 mm, a radius of curvature of a rear surface of the biconcave lens is 75.26 mm, and a distance between the front surface and the rear surface is 3.49 mm. The biconvex lens is made of H-ZF88, a radius of curvature of a front surface of the biconvex lens is 127.94 mm, a radius of curvature of a rear surface of the biconvex lens is −106.47 mm, and a distance between the front surface and the rear surface is 6 mm.

The astigmatism compensator is configured to compensate for astigmatism caused by the high-speed scanning of the two-dimensional acousto-optic deflector. The astigmatism causes light beam to focus in a scanning direction, and a focal length at a central wavelength $\lambda_0$ of the ultrafast laser is expressed as $$f = \frac{v^2 T_{scan}}{\lambda_0 \Delta f},$$

v being a sound speed of the two-dimensional acousto-optic deflector, $T_{scan}$ being a time required for scanning a line at a high speed, and $\Delta f$ being a bandwidth of a driving frequency of the two-dimensional acousto-optic deflector. A focal length of the astigmatism compensator in a light beam focusing direction which is expressed as $$f_c = -\frac{v^2 T_{scan}}{\lambda_0 \Delta f}$$

and the focal length of light beam focusing caused by the astigmatism are equal in magnitude and opposite in direction, so that the compensation can be conducted on the astigmatism caused by the high-speed scanning of the two-dimensional acousto-optic deflector.

Preferably, the astigmatism compensator may be a cylindrical lens, and a focal length of the cylindrical lens corresponds to the $T_{scan}$ being the time required for scanning a line at a high speed, and may be expressed as $$f_c = -\frac{v^2 T_{scan}}{\lambda_0 \Delta f}.$$

A laser transmissivity of the cylindrical lens reaches 90% or higher so as to make power of a tightly focused laser point meet a high-speed laser scanning requirement.

Preferably, the astigmatism compensator is a spatial light modulator and needs to load a phase hologram corresponding to the cylindrical lens, and a focal length of the spatial light modulator corresponds to the $T_{scan}$ being the time required for scanning a line at a high speed, and is expressed as $$f_c = -\frac{v^2 T_{scan}}{\lambda_0 \Delta f}.$$

A laser reflectivity of the spatial light modulator reaches 80% or higher so as to make the power of the tightly focused laser point meet the high-speed laser scanning requirement.

The focusing objective lens is configured to conduct tight-focusing on the laser beam. A numerical aperture of the focusing objective lens is larger than 0.7.

The observation assembly is configured to conduct online observation in a laser machining process. The observation assembly includes an optical splitter assembly, a tube lens and an image sensor which are arranged in sequence and located in the same light path. During working, the optical splitter assembly causes a laser to be incident on the focusing objective lens, a fluorescence signal, etc. generated in a machining process to be collected by means of the tube lens, and to be imaged on the image sensor.

Preferably, a light split assembly is a dichroic plate optical splitter.

Preferably, the light split assembly is a dichroic optical splitter prism.

FIG. 1 is a structural diagram of the two-photon-polymerization laser direct writing system based on an acousto-optic deflector provided in the embodiments of the present disclosure. As shown in FIG. 1, the system includes: an ultrafast laser device 1, an acousto-optic intensity modulator 2, a beam expander 3, an angular dispersion device 4, a relay lens 5, a scanning field center angular dispersion compensator 6, a first one-dimensional acousto-optic deflector 7, a second one-dimensional acousto-optic deflector 8, a two-dimensional acousto-optic deflector 9, a first biconvex lens 10, a meniscus lens 11, a biconcave lens 12, a second biconvex lens 13, a scanning field edge angular dispersion compensator 14, an astigmatism compensator 15, a first light guide plate 16, a second light guide plate 17, a first lens set 18, a second lens set 19, an optical splitter 20, a focusing objective lens 21, photoresist 22, an objective table 23, a tube lens 24, an image sensor 25 and a controller 26.

As shown in FIG. 1, the two-dimensional acousto-optic scanning assembly includes the ultrafast laser device 1, the acousto-optic intensity modulator 2, the beam expander 3, the scanning field center angular dispersion compensator 6, the two-dimensional acousto-optic deflector 9 and the scanning field edge angular dispersion compensator 14. During working, the ultrafast laser is emitted from the ultrafast laser device 1 and passes through the acousto-optic intensity modulator 2 to adjust the power of the ultrafast laser; a modulated laser beam is subjected to collimation and beam expansion while passing through the beam expander 3; and then the laser passes through the scanning field center angular dispersion compensator 6 to compensate for angular dispersion at a the center of the scanning field of the two-dimensional acousto-optic deflector 9, and passes through the two-dimensional acousto-optic deflector 9 to be deflected. Finally the scanning field edge angular dispersion compensator 14 compensates for angular dispersion at the edge of the scanning field.

The two-dimensional acousto-optic deflector 9 includes a first one-dimensional acousto-optic deflector 7 and a second one-dimensional acousto-optic deflector 8 which are orthogonal.

Preferably, the acousto-optic intensity modulator 2, the first one-dimensional acousto-optic deflector 7 and the second one-dimensional acousto-optic deflector 8 are separately controlled by the controller 26. A scanning direction of the first one-dimensional acousto-optic deflector 7 is perpendicular to a scanning direction of the second one-dimensional acousto-optic deflector 8. The first one-dimensional acousto-optic deflector 7 is controlled by the controller 26 to conduct high-speed line scanning, and after a line is scanned, the second one-dimensional acousto-optic deflector 8 is controlled to change a line scanning position, so that scanning of the whole machining flat surface is completed. The controller 26 controls the acousto-optic intensity modulator 2 to conduct light intensity modulation while controlling the two-dimensional acousto-optic deflector to complete flat scanning, and thus scanning of a specific pattern is realized on the machining flat surface.

The scanning field center angular dispersion compensator 6 is configured to compensate for the angular dispersion at the center of the scanning field, and angular dispersion, at the central wavelength $\lambda_0$ of the ultrafast laser, of the scanning field center angular dispersion compensator and the angular dispersion at the center of the scanning field of the two-dimensional acousto-optic deflector 9 are equal in magnitude and opposite in direction. An angular dispersion value at the center of the scanning field of the two-dimensional acousto-optic deflector 9 is expressed as $$\frac{d\alpha}{d\lambda} = \sqrt{2}\frac{f_0}{v},$$

$f_0$ being a central driving frequency of the two-dimensional acousto-optic deflector, and v being a sound speed of the two-dimensional acousto-optic deflector.

Preferably, the scanning field center angular dispersion compensator 6 includes the angular dispersion device 4 and the relay lens 5 which are arranged in sequence. The ultrafast laser is incident on the angular dispersion device 4 at a specific angle, so that a laser emerging from the angular dispersion device 4 has maximum power and highest energy utilization. Under the condition, an angular dispersion value, at the central wavelength $\lambda_0$ of the ultrafast laser, of the angular dispersion device 4 is α; focal power of the relay lens 5 is 0, and an angular magnification at the central wavelength $\lambda_0$ of the ultrafast laser is β, which is expressed as $$\alpha * \beta = -\sqrt{2}\frac{f_0}{v},$$

so that angular dispersion generated by the scanning field center angular dispersion compensator and the angular dispersion at the scanning field center are equal in magnitude and opposite in direction so as to compensate for astigmatism at the center of the scanning field.

Preferably, an included angle between a principal plane of the scanning field center angular dispersion compensator 6 and the one-dimensional acousto-optic deflector 7 in the two-dimensional acousto-optic deflector 9 is 45°.

The scanning field edge angular dispersion compensator 14 is configured to compensate for the angular dispersion at the edge of the scanning field of the two-dimensional acousto-optic deflector 9, and angular dispersion generated by the scanning field edge angular dispersion compensator and the angular dispersion at the scanning field edge are equal in magnitude and opposite in direction. An angular dispersion value at the edge of the scanning field is expressed as $$\frac{d\theta}{d\lambda} = \frac{\sqrt{f_1^2 f_2^2} - f_0}{v},$$

θ being a light beam deflection angle, $f_1$ and $f_2$ being driving frequencies of the two one-dimensional acousto-optic deflectors in the two-dimensional acousto-optic deflector 9 at the light beam deflection angle θ respectively, $f_0$ being a central driving frequency of the two-dimensional acousto-optic deflector 9, and v being a sound speed of the two-dimensional acousto-optic deflector 9. Angular dispersion values of the scanning field edge angular dispersion compensator 14 at different deflection angles θ is expressed as $$\frac{d\theta}{d\lambda} = \frac{\sqrt{f_1^2 f_2^2} - f_0}{v},$$

the angular dispersion of which and the angular dispersion at the edge of the scanning field are equal in magnitude and opposite in direction, so that compensation is conducted on the angular dispersion at the edge of the scanning field.

Preferably, the scanning field edge angular dispersion compensator 14 includes a front lens set and a rear lens set.

Further preferably, the front lens set includes a biconvex lens 10 and a meniscus lens 11 which are arranged in sequence. The biconvex lens 10 is made of H-K9L, a radius of curvature of a front surface of the biconvex lens is 48.12 mm, a radius of curvature of a rear surface of the biconvex lens is −31.16 mm, and a distance between the front surface and the rear surface is 6 mm; and the meniscus lens 11 is made of H-ZF88, a radius of curvature of a front surface of the meniscus lens is −31.03 mm, a radius of curvature of a rear surface of the meniscus lens is −119.94 mm, and a distance between the front surface and the rear surface is 2 mm.

Further preferably, the rear lens set includes a biconcave lens 12 and a biconvex lens 13 which is arranged in sequence. The biconcave lens 12 is made of H-K9L, a radius of curvature of a front surface of the biconcave lens is −95.81 mm, a radius of curvature of a rear surface of the biconcave lens is 75.26 mm, and a distance between the front surface and the rear surface is 3.49 mm. The biconvex lens 13 is made of H-ZF88, a radius of curvature of a front surface of the biconvex lens is 127.94 mm, a radius of curvature of a rear surface of the biconvex lens is −106.47 mm, and a distance between the front surface and the rear surface is 6 mm.

The astigmatism compensator 15 is configured to correct the astigmatism generated by the high-speed scanning of the first one-dimensional acousto-optic deflector 7. The astigmatism causes light beam focusing in a high-speed scanning direction of the first one-dimensional acousto-optic deflector 7, and has a focal length, at the central wavelength $\lambda_0$ of the ultrafast laser, being expressed as $$f = \frac{v^2 T_{scan}}{\lambda_0 \Delta f},$$

v being a sound speed of the first one-dimensional acousto-optic deflector 7, $T_{scan}$ being a time required for scanning a line at a high speed, and Δf being a bandwidth of a driving frequency of the one-dimensional acousto-optic deflector 7. A focal length of the astigmatism compensator 15 in the high-speed scanning direction of the first one-dimensional acousto-optic deflector 7 which is expressed as $$f_c = -\frac{v^2 T_{scan}}{\lambda_0 \Delta f},$$

and the focal length of light beam focusing generated by the high-speed scanning of the first one-dimensional acousto-optic deflector 7 are equal in magnitude and opposite in direction, so that the compensation can be conducted on the astigmatism generated by the high-speed scanning of the first one-dimensional acousto-optic deflector 7.

A light guide assembly includes a light guide plate 16 and a light guide plate 17 configured for transiting a light beam. A relay assembly includes the lens set 18 and the lens set 19, and a rear focal plane of the lens set 18 is coincided with a front focal plane of the lens set 19 to form a 4F relay system for guiding the light beam into the focusing objective lens 21.

The focusing objective lens 21 is configured to conduct tight-focusing on the laser beam and tightly focus the laser beam into the photoresist 22, and the photoresist 22 is located between the focusing objective lens 21 and the objective table 23. A numerical aperture of the focusing objective lens 21 is larger than 0.7.

The observation assembly is configured to conduct online observation in a laser machining process. The observation assembly includes the optical splitter 20, the tube lens 24 and the image sensor 25 which are arranged in sequence and located the same light path. During working, the optical splitter 20 causes a laser to be incident on the focusing objective lens 21, a fluorescence signal, etc. generated in a machining process to be collected by the tube lens 24, and to be imaged on the image sensor 25. The controller 26 control the image sensor 25 for realizing the online observation.

Figure 2:
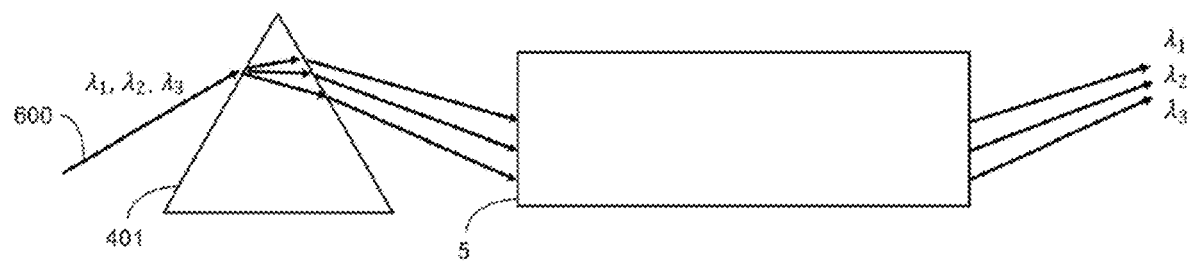
FIG. 2 is a schematic diagram of a scanning field center angular dispersion compensator according to the embodiment of the present disclosure.

In one example, as shown in FIG. 2, the scanning field center angular dispersion compensator 6 may be a refracting prism 401 and the relay lens 5. A vertex angle of the refracting prism 401 is expressed as $\theta_c = \pi - 2*\arctan(n)$, n being a refractive index, at the central wavelength of the ultrafast laser, of the refracting prism 401. A polarization direction of the ultrafast laser is parallel to a refracting plane where the ultrafast laser is refracted in the refracting prism, and an incident angle is expressed as $\theta_{in} = \arctan(n)$ and an emergence angle is expressed as $\theta_{out} = \theta_{in}$. At this time, the laser is not reflected when passing through the refracting plane of the prism, so energy utilization is high. An ultrafast laser with different wavelength components $\lambda_1$, $\lambda_2$ and $\lambda_3$ is incident on the refracting prism 401 in a direction shown as a light beam 600, the different wavelength components of the ultrafast laser have different refractive indexes in the refracting prism 401, and thus the different wavelength components emerge from the refracting prism 401 at different emergence angles, and emergence angle differences corresponding to the different wavelength components are angular dispersion. An angular dispersion value, at the central wavelength $\lambda_0$ of the ultrafast laser, of the refracting prism 401 is $\alpha$, then the laser passes through the relay lens 5, an angular magnification of the relay lens is $\beta$, and angular dispersion of an emergent laser is expressed as $$\alpha * \beta = -\sqrt{2}\frac{f_0}{v},$$

$f_0$ being the central driving frequency of the two-dimensional acousto-optic deflector 9, and v being the sound speed of the two-dimensional acousto-optic deflector 9, that is, the angular dispersion of the emergent laser and the angular dispersion of the center of the scanning field of the two-dimensional acousto-optic deflector 9 are equal in magnitude and opposite in direction, so that compensation can be conducted on the angular dispersion of the center of the scanning field of the two-dimensional acousto-optic deflector 9.

Figure 3:
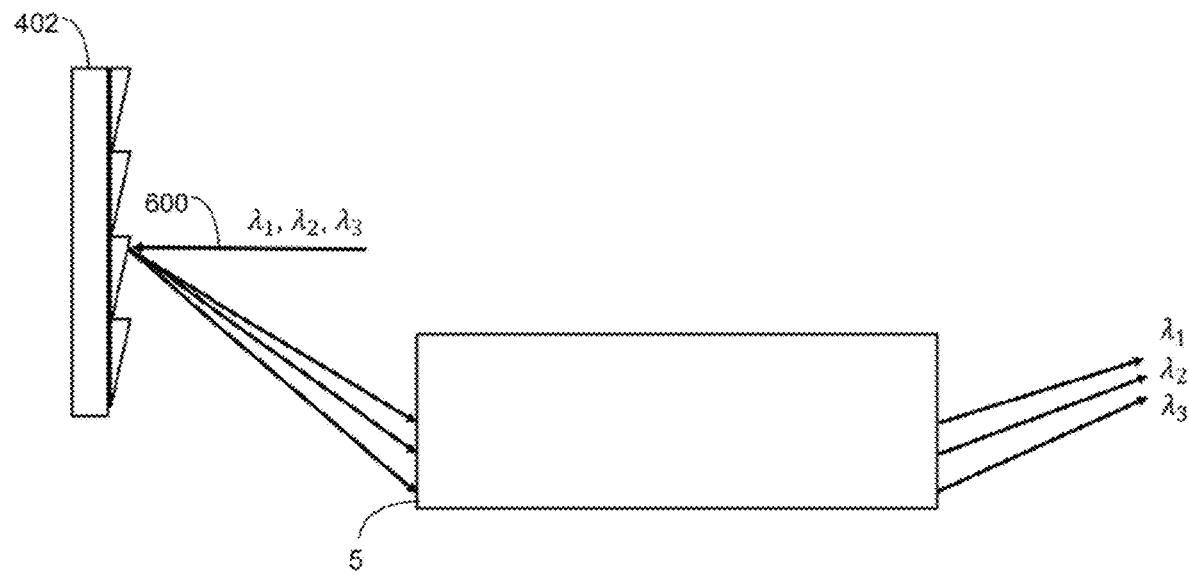
FIG. 3 is a schematic diagram of the scanning field center angular dispersion compensator according to the embodiment of the present disclosure.

In one example, as shown in FIG. 3, the scanning field center angular dispersion compensator 6 is a diffraction grating 402 and the relay lens 5. The incident angle at which the ultrafast laser is incident on the diffraction grating 402 is expressed as $\theta_{in} = \gamma$, $\gamma$ being an included angle between a grooving surface and a grating surface of the diffraction grating. At this time, the diffraction grating 402 has largest laser diffraction efficiency and highest energy utilization. The ultrafast laser with the different wavelength components $\lambda_1$, $\lambda_2$ and $\lambda_3$ is incident on the diffraction grating 402 in the direction shown as the light beam 600, the different wavelength components of the ultrafast laser have different diffraction angles after passing through gratings with consistent periods, and thus the different wavelength components emerge from the diffraction grating 402 at different emergence angles, and emergence angle differences corresponding to the different wavelength components are angular dispersion. An angular dispersion value, at the central wavelength $\lambda_0$ of the ultrafast laser, of the diffraction grating 402 is $\alpha$, then the laser passes through the relay lens 5, the angular magnification of the relay lens is $\beta$, and the angular dispersion of the emergent laser is expressed as $$\alpha * \beta = -\sqrt{2}\frac{f_0}{v},$$

$f_0$ being the central driving frequency of the two-dimensional acousto-optic deflector 9, and v being the sound speed of the two-dimensional acousto-optic deflector 9, that is, the angular dispersion of the emergent laser and the angular dispersion of the center of the scanning field of the two-dimensional acousto-optic deflector 9 are equal in magnitude and opposite in direction, so that the compensation is conducted on the angular dispersion of the center of the scanning field of the two-dimensional acousto-optic deflector 9.

Figure 4:
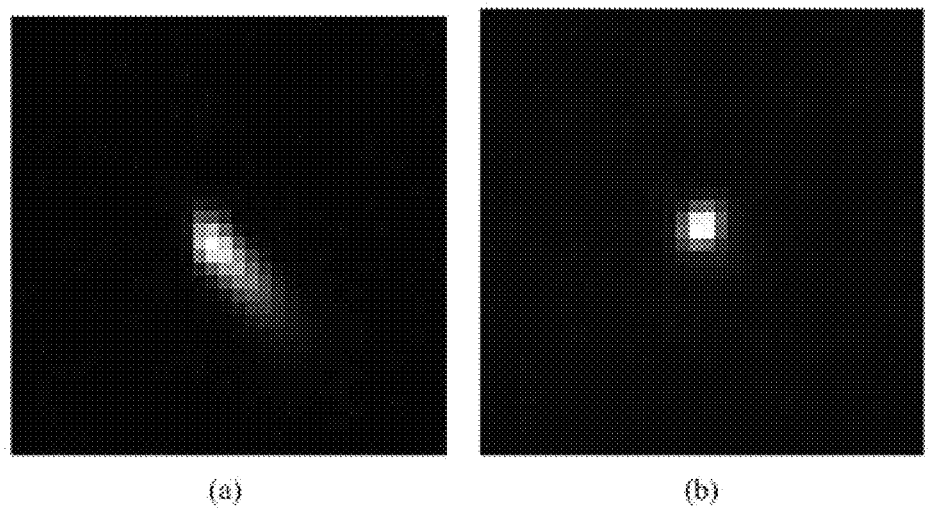
FIG. 4 is a compensation effect image of a scanning field edge angular dispersion compensator according to the embodiment of the present disclosure.

In one example, as shown in FIG. 4, (a) in FIG. 4 is a test diagram of a light spot of the edge of the scanning field of the two-dimensional acousto-optic deflector 9, and the light spot has angular dispersion and is stretched and deformed in an angular dispersion direction; and (b) in FIG. 4 is a test diagram of a light spot after compensating for the angular dispersion of the edge of the scanning field by using the scanning field edge angular dispersion compensator 14, compensation is conducted on angular dispersion of the light spot, tension and deformation in the angular dispersion direction disappear, and the light spot becomes into circular.

Figure 5:
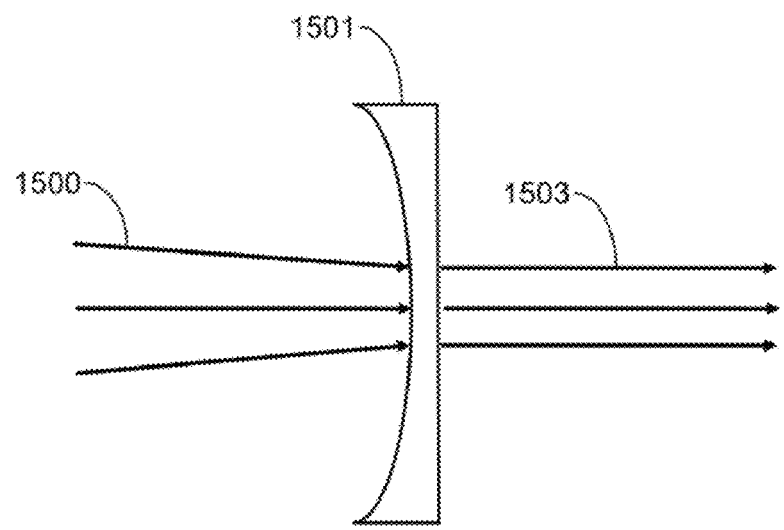
FIG. 5 is a schematic diagram of an astigmatism compensator according to the embodiment of the present disclosure.

In one example, as shown in FIG. 5, the astigmatism compensator 15 is a cylindrical lens 1501. A light beam 1500 focused in a high-speed scanning direction of the first one-dimensional acousto-optic deflector 7 passes through the cylindrical lens 1501, and a focal length of the cylindrical lens 1501 is expressed as $$f_c = -\frac{v^2 T_{scan}}{\lambda_0 \Delta f},$$

v being a sound speed of the first one-dimensional acousto-optic deflector 7, where the first one-dimensional acousto-optic deflector 7 and the second one-dimensional acousto-optic deflector 8 are consistent in sound speed, and are consistent with the sound speed of the two-dimensional acousto-optic deflector, $T_{scan}$ being the time required for scanning a line at a high speed, and $\Delta f$ being the bandwidth of the driving frequency of the first one-dimensional acousto-optic deflector 7. The focal length of the astigmatism compensator 15 in the high-speed scanning direction of the first one-dimensional acousto-optic deflector 7 and the focal length of the light beam focusing generated by the high-speed scanning of the first one-dimensional acousto-optic deflector 7 are equal in magnitude and opposite in direction, so that the compensation is conducted on the astigmatism generated by the high-speed scanning of the first one-dimensional acousto-optic deflector 7. An emergent light beam 1503 subjected to compensation is a collimated beam.

Figure 6:
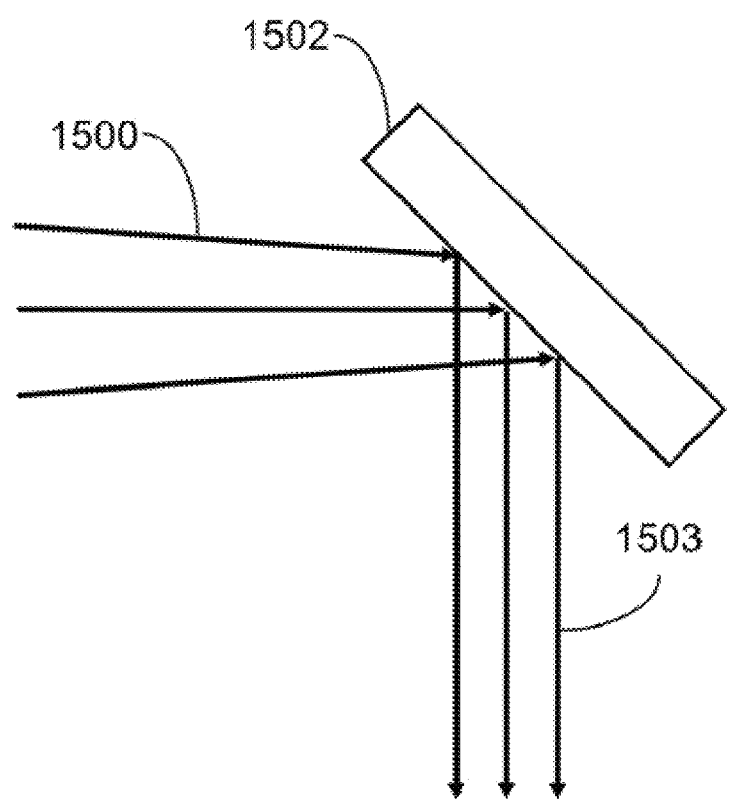
FIG. 6 is a schematic diagram of the astigmatism compensator according to the embodiment of the present disclosure.

In one example, as shown in FIG. 6, the astigmatism compensator 15 is a spatial light modulator 1502. The light beam 1500 focused in the high-speed scanning direction of the first one-dimensional acousto-optic deflector 7 passes through the spatial light modulator 1502, a wavefront of the light beam 1500 is modulated, a wavefront function for modulation is $$\varphi(x) = \frac{x^2}{2} * \frac{\Delta f}{v^2 T_{scan}},$$

and x being a coordinate of the first one-dimensional acousto-optic deflector 7 in the high-speed scanning direction, v being the sound speed of the first one-dimensional acousto-optic deflector 7, $T_{scan}$ being the time required for scanning a line at a high speed, and $\Delta f$ being the bandwidth of the driving frequency of the first one-dimensional acousto-optic deflector 7. The focal length of the astigmatism compensator 15 in the high-speed scanning direction of the first one-dimensional acousto-optic deflector 7 and the focal length of the light beam focusing generated by the high-speed scanning of the first one-dimensional acousto-optic deflector 7 are equal in magnitude and opposite in direction, so that the compensation is conducted on the astigmatism generated by the high-speed scanning of the first one-dimensional acousto-optic deflector 7. The wavefront of the modulated light beam 1500 becomes a plane wave, and the emergent light beam 1503 is the collimated beam.

It is easily understood by those skilled in the art that the above description is only preferred embodiments of the present disclosure, not intended to limit the present disclosure, and any modifications, equivalent replacements, improvements, etc. made within the spirit and principles of the present disclosure should be included within the scope of protection of the present disclosure.

What is claimed is:

1. A two-photon-polymerization laser direct writing system based on an acousto-optic deflector, comprising: an ultrafast laser device, a beam expander, a scanning field center angular dispersion compensator, a two-dimensional acousto-optic deflector, a scanning field edge angular dispersion compensator, an astigmatism compensator and a focusing objective lens, wherein the ultrafast laser device is configured to emit an ultrafast laser;

the beam expander is configured to conduct collimation and beam expansion on the ultrafast laser; the ultrafast laser subjected to the collimation and beam expansion passes through the scanning field center angular dispersion compensator and the two-dimensional acousto-optic deflector in sequence;

the scanning field center angular dispersion compensator is configured to conduct precompensation on an angular dispersion at a center of a scanning field of the two-dimensional acousto-optic deflector according to parameters of the two-dimensional acousto-optic deflector;

the two-dimensional acousto-optic deflector is configured to deflect, by a predetermined angle, the ultrafast laser subjected to the precompensation on the angular dispersion at the center of the scanning field, so as to make the laser deflected meet a laser direct writing requirement; the two-dimensional acousto-optic deflector includes two one-dimensional acousto-optic deflectors which are orthogonal to each other;

the ultrafast laser deflected by the two-dimensional acousto-optic deflector passes the scanning field edge angular dispersion compensator and the astigmatism compensator in sequence, and the scanning field edge angular dispersion compensator is configured to compensate for an angular dispersion at an edge of the scanning field of the two-dimensional acousto-optic deflector; the astigmatism compensator is configured to compensate for astigmatism generated in a process of deflecting the ultrafast laser by the two-dimensional acousto-optic deflector; and the focusing objective lens is configured to conduct tight-focusing on the ultrafast laser subjected to the compensation by the astigmatism compensator and then emit the ultrafast laser to a light-sensitive material, so as to conduct a two-photon-polymerization laser direct writing on the light-sensitive material, and the predetermined angle is controlled by the two-dimensional acousto-optic deflector, so as to realize the two-photon-polymerization laser direct writing on different positions of the light-sensitive material.

2. The two-photon-polymerization laser direct writing system according to claim 1, wherein the scanning field center angular dispersion compensator comprises: an angular dispersion device and a relay lens, which are arranged in sequence, wherein an angular dispersion value at the center of the scanning field of the two-dimensional acousto-optic deflector is $$\sqrt{2}\frac{f_0}{v},$$

where $f_0$ is a central driving frequency of the two-dimensional acousto-optic deflector, and v is a sound speed of the two-dimensional acousto-optic deflector; and the ultrafast laser is incident on the angular dispersion device at a predetermined incident angle, so that the ultrafast laser emerging from the angular dispersion device has maximum power and highest energy utilization; when the ultrafast laser emerging from the angular dispersion device has the maximum power, the angular dispersion value, at a central wavelength $\lambda_0$ of the ultrafast laser, of the angular dispersion device is $\alpha$; a focal power of the relay lens is 0, and an angular magnification at the central wavelength $\lambda_0$ of the ultrafast laser is $\beta$; and $$\alpha * \beta = -\sqrt{2}\frac{f_0}{v}.$$

3. The two-photon-polymerization laser direct writing system according to claim 1, wherein the scanning field edge angular dispersion compensator comprises: a front lens set and a rear lens set, wherein the front lens set comprises a biconvex lens and a meniscus lens, which are arranged in sequence, and the rear lens set comprises a biconcave lens and a biconvex lens, which are arranged in sequence;

angular dispersion generated by the scanning field edge angular dispersion compensator and angular dispersion at the edge of the scanning field are equal in magnitude and opposite in direction; and an angular dispersion value at the edge of the scanning field is expressed as $$\frac{d\theta}{d\lambda} = \frac{\sqrt{f_1^2 f_2^2} - f_0}{v},$$

where $\theta$ is a light beam deflection angle, and $f_1$ and $f_2$ is driving frequencies of the two one-dimensional acousto-optic deflectors at the light beam deflection angle $\theta$ respectively.

4. The two-photon-polymerization laser direct writing system according to claim 1, wherein a focal length $f_c$ of the astigmatism compensator in a light beam focusing direction and a focal length of light beam focusing generated by the astigmatism in the process of deflecting the ultrafast laser by the two-dimensional acousto-optic deflector are equal in magnitude and opposite in direction, and the focal length $f_c$ of the astigmatism compensator in a light beam focusing direction is expressed as $$f_c = -\frac{v^2 T_{scan}}{\lambda_0 \Delta f},$$

where $T_{scan}$ is a time required for scanning a line by the two-dimensional acousto-optic deflector, and $\Delta f$ is a bandwidth of a driving frequency of the two-dimensional acousto-optic deflector.

5. The two-photon-polymerization laser direct writing system according to claim 2, wherein the angular dispersion device is a refracting prism, and a vertex angle of the refracting prism is expressed as $\theta_c = \pi - 2*\arctan(n)$, where n is a refractive index, at the central wavelength $\lambda_0$ of the ultrafast laser, of the refracting prism, a polarization direction of the ultrafast laser is parallel to a refracting plane where the ultrafast laser is refracted in the refracting prism, and the predetermined incident angle is expressed as $\theta_{in} = \arctan(n)$ and an emergence angle is expressed as $\theta_{out} = \theta_{in}$.

6. The two-photon-polymerization laser direct writing system according to claim 2, wherein the angular dispersion device is a diffraction grating, and the predetermined incident angle is expressed as $\theta_{in} = \gamma$, where $\gamma$ is an included angle between a grooving surface and a grating surface of the diffraction grating.

7. The two-photon-polymerization laser direct writing system according to claim 4, wherein the two one-dimensional acousto-optic deflectors which are orthogonal to each other comprise: a first one-dimensional acousto-optic deflector and a second one-dimensional acousto-optic deflector, wherein the first one-dimensional acousto-optic deflector is configured to scan the ultrafast laser at a high speed, and the ultrafast laser is focused in a high-speed scanning direction, so as to cause the astigmatism; and the second one-dimensional acousto-optic deflector changes a scanning position into a next line in a direction orthogonal to the high-speed scanning direction of the first one-dimensional acousto-optic deflector after the first one-dimensional acousto-optic deflector completes high-speed scanning of a line, so as to deflect the ultrafast laser by the predetermined angle.

8. The two-photon-polymerization laser direct writing system according to claim 7, wherein the astigmatism compensator is a cylindrical lens;

a focal length of the cylindrical lens is expressed as $$f_c = -\frac{v^2 T_{scan}}{\lambda_0 \Delta f};$$

and a focal length of the astigmatism compensator in the high-speed scanning direction of the first one-dimensional acousto-optic deflector and a focal length of light beam focusing generated by high-speed scanning of the first one-dimensional acousto-optic deflector are equal in magnitude and opposite in direction.

9. The two-photon-polymerization laser direct writing system according to claim 7, wherein the astigmatism compensator is a spatial light modulator;

a wavefront function, used by the spatial light modulator for modulation is $$\varphi(x) = \frac{x^2}{2} * \frac{\Delta f}{v^2 T_{scan}},$$

where x is a coordinate of the first one-dimensional acousto-optic deflector in the high-speed scanning direction; and a focal length of the spatial light modulator in the high-speed scanning direction of the first one-dimensional acousto-optic deflector and a focal length of light beam focusing generated by high-speed scanning of the first one-dimensional acousto-optic deflector are equal in magnitude and opposite in direction.

10. The two-photon-polymerization laser direct writing system according to claim 1, wherein a numerical aperture of the focusing objective lens is larger than 0.7.

11. The two-photon-polymerization laser direct writing system according to claim 2, wherein a numerical aperture of the focusing objective lens is larger than 0.7.

12. The two-photon-polymerization laser direct writing system according to claim 3, wherein a numerical aperture of the focusing objective lens is larger than 0.7.

13. The two-photon-polymerization laser direct writing system according to claim 4, wherein a numerical aperture of the focusing objective lens is larger than 0.7.

14. The two-photon-polymerization laser direct writing system according to claim 5, wherein a numerical aperture of the focusing objective lens is larger than 0.7.

15. The two-photon-polymerization laser direct writing system according to claim 6, wherein a numerical aperture of the focusing objective lens is larger than 0.7.

16. The two-photon-polymerization laser direct writing system according to claim 7, wherein a numerical aperture of the focusing objective lens is larger than 0.7.

17. The two-photon-polymerization laser direct writing system according to claim 8, wherein a numerical aperture of the focusing objective lens is larger than 0.7.

18. The two-photon-polymerization laser direct writing system according to claim 9,
wherein a numerical aperture of the focusing objective lens is larger than 0.7.

* * * * *